United States Patent [19]

Kaganowicz et al.

[11] Patent Number: 4,980,041

[45] Date of Patent: Dec. 25, 1990

[54] METHOD OF MAKING LIQUID CRYSTAL DEVICES WITH IMPROVED ADHERENCE

[75] Inventors: Grzegorz Kaganowicz, Belle Mead, N.J.; John W. Robinson, Levittown, Pa.

[73] Assignee: General Electric Company, Princeton, N.J.

[21] Appl. No.: 428,694

[22] Filed: Oct. 30, 1989

[51] Int. Cl.$^5$ .................... C23C 14/34; B05D 3/06
[52] U.S. Cl. ................ 204/192.15; 204/192.12; 427/39; 427/41
[58] Field of Search .............. 204/192.12, 192.15, 204/192.26, 192.27, 192.28; 427/39, 41, 109, 122

[56] References Cited

U.S. PATENT DOCUMENTS

| | | |
|---|---|---|
| 4,146,656 | 3/1979 | Kinugawa et al. .............. 427/109 |
| 4,402,999 | 9/1983 | Tatsumichi et al. ............ 427/126.3 |
| 4,405,208 | 9/1983 | Shirai .................................. 350/341 |
| 4,414,085 | 11/1983 | Wickersham et al. ......... 204/192.15 |
| 4,437,731 | 3/1984 | Sudo et al. ......................... 350/340 |
| 4,629,547 | 12/1986 | Honda et al. .................... 204/192.15 |
| 4,634,228 | 1/1987 | Iwasaki et al. .................... 350/341 |
| 4,643,531 | 2/1987 | Inoue ................................... 350/341 |
| 4,663,008 | 5/1987 | Takeska et al. ................ 204/192.26 |
| 4,674,842 | 6/1987 | Van de Venne ................... 350/340 |
| 4,705,359 | 11/1987 | Amstutz et al. .................... 350/341 |
| 4,723,839 | 2/1988 | Nakanowatari et al. ......... 350/341 |

Primary Examiner—Nam X. Nguyen
Attorney, Agent, or Firm—J. S. Tripoli; D. H. Irlbeck; L. L. Hallacher

[57] ABSTRACT

The adherence of the alignment layer of a liquid crystal cell is improved by simultaneously glow discharging and sputtering the alignment materials onto the conductors and substrates of the liquid crystal cell.

4 Claims, 1 Drawing Sheet

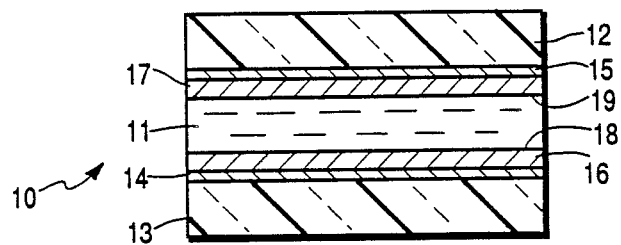

METHOD OF MAKING LIQUID CRYSTAL DEVICES WITH IMPROVED ADHERENCE

BACKGROUND

This invention relates generally to liquid crystal devices and particularly to such devices having improved adherence of the alignment layers, and to a method of forming such layers.

Display devices which utilize twisted nematic liquid crystals include a liquid crystal material disposed between two insulative substrates, at least one of which is transparent. Electrical control electrodes are disposed on the surfaces of the substrates which face the liquid crystal material. In one type of liquid crystal device both the substrates and their associated electrodes are transparent to permit light to pass through the entire structure when the elongated molecules of the liquid crystal material are in one orientation, or to be opaque to light for another orientation of the liquid crystal molecules. In another type of liquid crystal device only one substrate and its associated electrode are transparent. In this type of device, light passes through the substrate and is reflected off the liquid crystal material for one state of the liquid crystal material. For another state of the liquid crystal material, light passes through the liquid crystal material and is reflected from the other substrate. For both types of devices, images are formed by voltage biasing the control electrodes of selected cells to change the light transmission capabilities of the energized cells.

In both types of liquid crystal devices the molecules of the liquid crystal material are elongated and must be properly aligned with the surfaces of the substrates in order to assure uniformity of operation and high contrast of the displayed information. The required alignment of the liquid crystal molecules is achieved by coating the surfaces of the electrodes with an alignment material and rubbing the alignment material in the direction desired for the alignment of the molecules.

In active matrix liquid crystal display devices a switching device, such as a thin film transistor (TFT) or a solid state diode, is associated with each of the liquid crystal elements within the display. The alignment layer for active matrix liquid crystal devices must control three properties to provide optimum operation and contrast. The properties are the tilt angle between the principal axis of the molecules and the substrate, molecular alignment (parallel orientation of the liquid crystal molecules), and a high RC time constant. The tilt angle should be between 1° and 5° to provide a suitable response time and to optimize the viewability of the device. Good molecular alignment of the liquid crystal molecules is necessary to provide uniformity of operation and high contrast between the energized and deenergized states. Because a high RC time constant is needed, the resistivity of the liquid crystal material must be sufficiently high to assure that the liquid crystal cells are capable of storing a charge for a time period of sufficient duration to display the desired image. It is also important for the alignment layers to uniformly adhere to the transparent conductors and to the substrates of the liquid crystal device.

For these reasons there is a need for a liquid crystal cell useful with active matrix liquid crystal devices and which has acceptable tilt angle, good alignment of the liquid crystal molecules, a RC time constant which is stable over long periods of time and upon exposure to elevated temperatures, and which has good adherence to the cell conductors and substrate. The present invention fulfills these needs.

CROSS REFERENCE TO RELATED APPLICATIONS

U.S. application Ser. No. (428,693) filed on even date herewith by G. Kaganowicz, F.P. Cumo, and L.J. Vieland, entitled "Alignment Layer For Liquid Crystal Devices And Method Of Forming" describes technology related to that described herein.

U.S. application Ser. No. (428,698) filed on even date herewith by G. Kaganowicz, entitled "Inorganic Alignment Layer For Liquid Crystal Devices And Method Of Forming" describes technology related to that of the described herein.

U.S. application Ser. No. (428,696) filed on even date herewith by G. Kaganowicz and J.W. Robinson entitled "Method Of Making Liquid Crystal Devices With Improved Time Constant" describes technology related to that described herein.

The teachings of these applications are incorporated herein by reference.

SUMMARY

A method of depositing an alignment layer onto the conductors and substrates of a liquid crystal cell comprises the steps of simultaneously sputtering and glow discharge depositing the alignment layer materials onto the conductors and the substrates.

BRIEF DESCRIPTION OF THE DRAWINGS

The FIGURE is a simplified cross section of a preferred embodiment.

DETAILED DESCRIPTION

In the FIGURE, a liquid crystal device 10 includes a liquid crystal material 11 disposed between two transparent insulative substrates 12 and 13. A transparent conductor 14 is disposed on the surface of the substrate 13 which faces the liquid crystal material 11. Any solid state switching devices, such as TFT's (thin film transistors) or MIM's (metal-insulator-metal diodes) which are required for an active matrix display device are not shown. However, the space needed for the solid state switching devices typically is provided by omitting a small corner of the electrode 14, and fabricating the solid state switching device in the space thus provided using solid state manufacturing techniques, which are known to those skilled in the art. A transparent conductor 15 is provided on the surface of the substrate 12 which faces the liquid crystal material 11. An alignment layer 16, which provides the required molecular alignment, and good tilt angle, is disposed over the transparent conductor 14. Similarly, an alignment layer 17, which also provides the required molecular alignment, and good tilt angle, is deposited over the transparent conductor 15 of the substrate 12.

The adhesion of the alignment layers 16 and 17 to the conductors 14 and 15 and the substrates 12 and 13 must be sufficient to permanently hold the alignment layer on the conductors and substrates. Separation of the alignment layer causes objectionable blotches in the display and the display must be rejected.

Excellent adhesion is attained with the invention. The alignment layers 16 and 17 are applied to the substrates 12 and 13 by simultaneously sputtering and depositing (by a glow discharge) an organic nitrogen containing coating. Preferably the starting materials are $C_2H_2$ and nitrogen, and the final concentration of nitrogen in the alignment layers is 8 to 14%. Several conditions must be met in order for such simultaneous sputtering and glow discharge deposition to occur. Depending on the deposition conditions and starting materials used, during the plasma deposition, in addition to forming a coating on the substrate, a coating may or may not form on the electrode of the glow discharge equipment. When $C_2H_2$ and nitrogen are used, a coating forms on the discharge electrode when the $C_2H_2$ flow is in excess of the nitrogen flow. When the nitrogen flow is in excess of the $C_2H_2$ flow no coating is formed on the electrode and whatever material is present on the electrode surface is sputtered onto the substrate. The simultaneous sputtering and glow discharge deposition of an organic nitrogen containing coating requires preparation of the equipment prior to coating the liquid crystal cell. The equipment is prepared by coating the discharge electrode with an organic coating. This coating is made preferably by glow discharge from acetylene and nitrogen using acetylene flow in excess of nitrogen flow during the glow discharge. The glow discharge equipment is common in the art and need not be described herein. The glow discharge bell jar is evacuated and acetylene and nitrogen are introduced into the bell jar with acetylene being in excess of nitrogen, while power is applied to the discharge electrodes, and the electrodes are coated with an organic coating. The liquid crystal cell is then placed in the bell jar and an alignment layer is deposited using glow discharge deposition, again, using acetylene and nitrogen as starting materials. However, when the liquid crystal cell is being coated, the nitrogen is in excess of the acetylene. This causes the simultaneous deposition and sputtering of the alignment layer material onto the liquid crystal cell substrates, thereby substantially improving the adhesion of the alignment layers to the liquid crystal substrates.

The following examples give details and advantages of a preferred embodiment of the invention.

EXAMPLE 1

Prior to processing the liquid crystal cell, the electrode for the deposition in this example was prepared as follows:

The system was evacuated (without samples) and 24 sccm of $C_2H_2$ and 3 sccm of $N_2$ were then introduced into the system at $20\mu$ pressure. 100 W of RF power at 13.56 MHz was applied for 10 minutes. A coating approximately 1 $\mu$m thick was formed on the electrodes.

A liquid crystal cell substrate was placed in a glow discharge system on a plate 1" away from the previously prepared electrode. The system was evacuated to $10^{-5}$ torr and 16 sccm of $N_2$ and 8 sccm of acetylene were introduced into the system at a pressure of $30\mu$. 300 W of 13.56 MHz power was applied to the electrodes for 45 sec. These conditions produced a coating 300Å thick with a nitrogen content of 11%. The coating index of refraction was 2.0. The coating was adherent to both the conductors and glass parts of the substrate as measured with the scotch tape adhesion test. Measurement of a wafer placed on the electrode showed no deposition on the electrode.

EXAMPLE 2

A coating was made on a liquid crystal cell substrate as in example 1 except that a clean electrode was used and the deposition time was 1 minute. Again about 300Å of coating was deposited. The coating contained about 10% of $N_2$ (as measured by AES) and the adhesion was marginal. (Small areas of the coating came off during the scotch tape adhesion test).

Substrates from both examples were made into cells. The RC time constant in both cells was about 0.3 sec and did not change after 1 week exposure to 90° C. and 90° RH. However, the cell prepared in example 2 showed areas of poor alignment, a characteristic of alignment layer adhesion loss.

What is claimed is:

1. A method of forming a molecular alignment layer on the conductors and substrates of a liquid crystal cell, using discharge equipment having a discharge electrode comprising the steps of:

coating said discharge electrode with a coating of $C_2H_2$;

placing said substrate into said equipment and simultaneously introducing a first percentage of nitrogen and a second percentage of $C_2H_2$ into said discharge equipment, said first percentage being greater than said second percentage; and applying a selected power to said discharge electrode for a selected time.

2. The method of claim 1 wherein said coating is applied to said discharge electrode using a third percentage of $C_2H_2$ and a fourth percentage of nitrogen, where said third percentage exceeds said fourth percentage.

3. A method of depositing the materials for the alignment layer of a liquid crystal cell onto the conductors and substrates of said liquid crystal cell, using discharge equipment having a discharge electrode, comprising the steps of:

initially coating said discharge electrode with a mixture of nitrogen and $C_2H_2$; and simultaneously sputtering and glow discharge depositing $C_2H_2$ and nitrogen as the alignment layer materials onto said conductors and said substrates.

4. The method of claim 3 wherein said alignment layer includes 8 to 14% nitrogen.

* * * * *